(12) United States Patent
Agrawal

(10) Patent No.: US 10,756,679 B2
(45) Date of Patent: Aug. 25, 2020

(54) REDUCING SUPPLY TO GROUND CURRENT

(71) Applicant: Texas Instruments Incorporated, Dallas, TX (US)

(72) Inventor: Meghna Agrawal, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/858,141

(22) Filed: Dec. 29, 2017

(65) Prior Publication Data
US 2019/0207562 A1 Jul. 4, 2019

(51) Int. Cl.
*H03F 3/45* (2006.01)
*H03F 1/26* (2006.01)
*H03K 19/20* (2006.01)

(52) U.S. Cl.
CPC ........... *H03F 1/26* (2013.01); *H03F 3/45192* (2013.01); *H03F 3/45219* (2013.01); *H03F 3/45475* (2013.01); *H03F 2200/78* (2013.01); *H03F 2200/87* (2013.01); *H03K 19/20* (2013.01)

(58) Field of Classification Search
CPC .... H03F 1/26; H03F 3/45219; H03F 2200/78; H03F 2200/87; H03F 3/45183; H03F 3/45179; H03F 3/45192; H03F 3/45188; H03F 3/3022; H03F 1/307; H03F 3/30; H03F 3/3001; H03F 3/45; H03F 2203/30009; H03K 19/20
USPC ........ 330/253, 255, 258, 259, 260, 270, 290
See application file for complete search history.

(56) References Cited

U.S. PATENT DOCUMENTS

| | | | |
|---|---|---|---|
| 8,289,074 B2* | 10/2012 | Yamamoto | H03F 3/217 327/103 |
| 9,524,798 B2* | 12/2016 | Mandal | G11C 27/026 |
| 2010/0231430 A1* | 9/2010 | Nakajima | H03F 3/45183 341/155 |
| 2011/0234440 A1* | 9/2011 | Danjo | H03K 3/356139 341/158 |

* cited by examiner

*Primary Examiner* — Khanh V Nguyen
(74) *Attorney, Agent, or Firm* — Ebby Abraham; Charles A. Brill; Frank D. Cimino

(57) ABSTRACT

An apparatus to prevent supply-to-ground current in a comparator is disclosed. The apparatus includes circuitry to determine if first and second output nodes of the comparator have respectively reached first and second logic levels, and circuitry responsive to a determination that the voltage at the first and second output nodes of the comparator has reached the first and second logic levels, to generate a signal. In addition, the apparatus includes circuitry to supply the signal to a transistor, the signal to turn off the transistor and prevent the flow of supply-to-ground current through the comparator.

9 Claims, 8 Drawing Sheets

REDUCING SUPPLY TO GROUND CURRENT

FIELD OF THE DISCLOSURE

This disclosure relates generally to supply-to-ground current, and, more particularly, to the reduction of supply-to-ground current.

BACKGROUND

In electronics, a comparator is a device that compares two voltages or currents and outputs a digital signal indicating which is larger. A comparator typically includes two analog input terminals V+ and V− and one binary digital output V. It is commonly used in devices that measure and digitize analog signals, such as analog-to-digital converters. Comparators receive an analog signal and produce a digital bit. Comparators are evaluated based upon their ability to distinguish between tiny differences in input voltages as quickly as possible. In order to reduce the effect of input referred offset voltage, a preamplifier and latch circuit architecture is commonly used to achieve high speed and accuracy. Challenges to the optimal performance of comparators include the attenuation of accuracy due to offset voltage, the effect of kickback noise on resolution and excessive current consumption.

BRIEF DESCRIPTION OF THE DRAWINGS

The figures are not to scale. Wherever possible, the same reference numbers will be used throughout the drawing(s) and accompanying written description to refer to the same or like parts.

DETAILED DESCRIPTION

The comparator in a Sigma Delta analog-to-digital converter (ADC) runs at a sampling rate. The time available to resolve input voltage differences at high sampling rates is very short. In order to resolve input voltage differences at higher sampling rates, the use of a very high power comparator is involved.

In an example technology, flicker noise in PMOS-type architectures is about 10 times lower than in NMOS-type architectures. Because meeting noise specifications for noise critical blocks in the ADC is important, a PMOS-based architecture can be used for noise critical blocks (like a digital-to-analog converter-DAC, gmCell). In addition, PMOS-based architectures simplify the biasing needs of the example ADC. PMOS-based comparators can be slower than NMOS-based comparators for the same sized transistors. Examples described herein provide a high speed and low power PMOS-based comparator.

Figure 1:
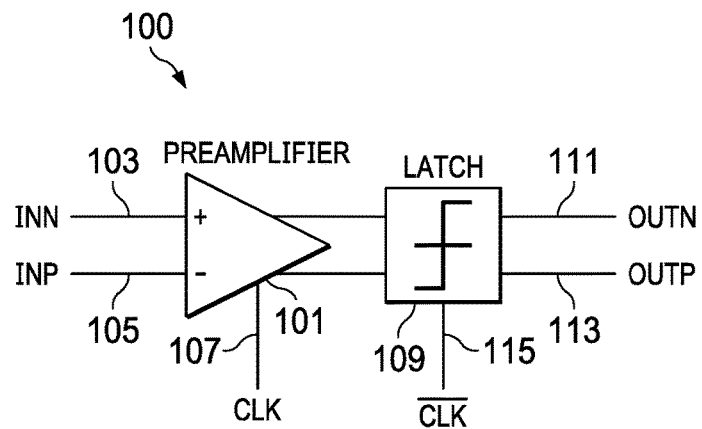
FIG. 1 is diagram of a comparator that uses a preamplifier and latch architecture as described in detail with reference to FIG. 2A.

FIG. 1 is a comparator 100 that uses a preamplifier and latch architecture. Referring to FIG. 1, the preamplifier 101 includes inputs INn 103, and INp 105, and clock 107. The latch 109 includes outputs outn 111, and outp 113, and clock 115. The architecture of FIG. 1 enables the size of the latch 109 to be reduced because of the use of the preamplifier 101. For example, in ADC with Fs=1.6 GHz the preamplifier 101 and the latch 109 use 640 uA (e.g., preamplifier 470 uA and latch 170 uA).

Figure 2A:
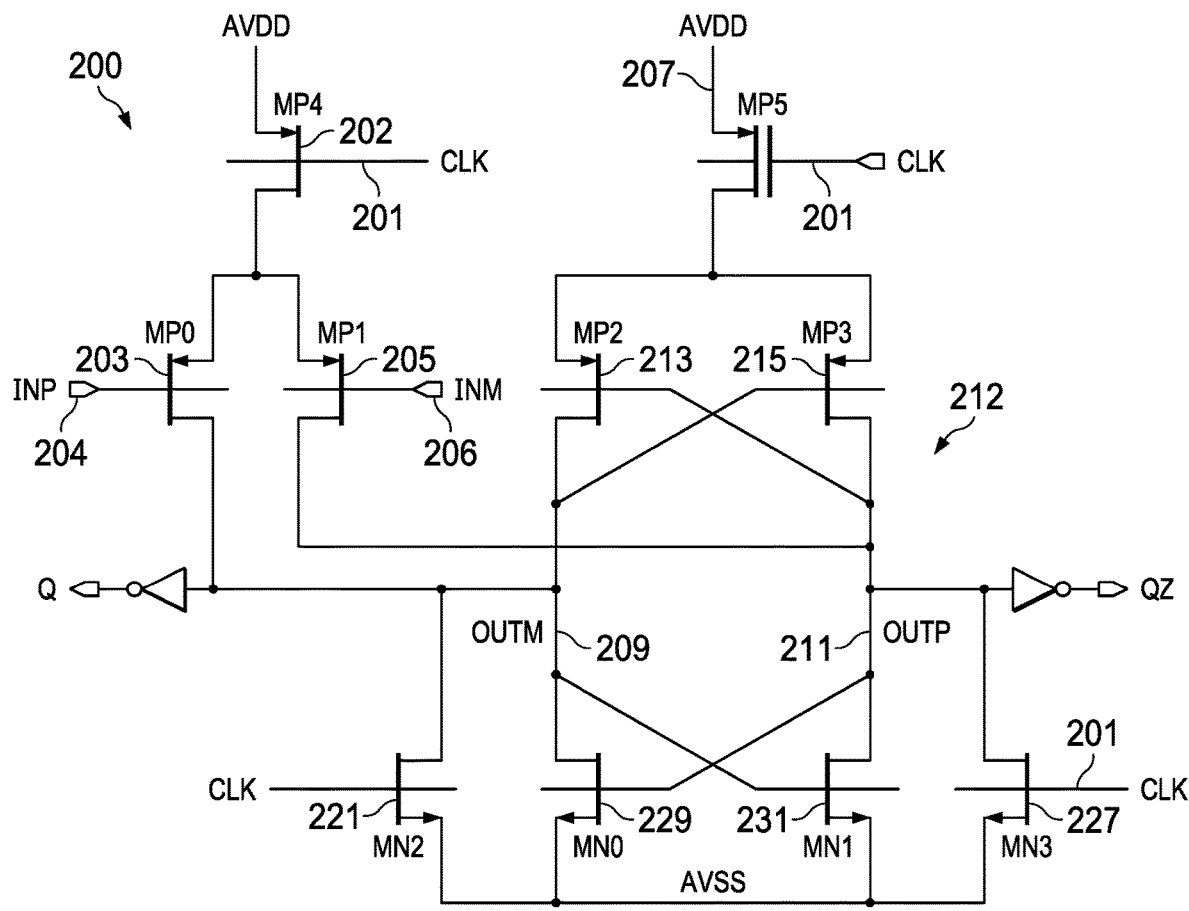
FIG. 2A is a schematic of an example implementation of the comparator circuit of FIG. 1 that includes a differential amplifier and latch architecture.

FIG. 2A is a schematic of an example implementation of comparator circuit 100 of FIG. 1 that includes a differential amplifier and latch architecture. FIG. 2A shows a differential amplifier 200 that includes transistor 202 and transistor 203, input INP 204, transistor 205, input INM 206 and outputs OUTM 209 and OUTP 211. The differential amplifier 200 is coupled to a latch 212 that includes transistors 213, 215, 229 and 231.

Referring to FIG. 2A, inputs INP 204 and INM 206 to the differential amplifier 200 are received by the transistors MP0 203 and MP1 205. In some examples, when the CLK 201 goes "low," the PMOS transistors (MP0 203, MP1 205, MP2 213, MP3 215) are switched ON. In response, a differential voltage is developed at nodes OUTM 209 and OUTP 211. Moreover, by virtue of the operation of the latch 212, the nodes OUTM 209 and OUTP 211 go to either supply or ground (e.g., the voltage at one of the nodes goes to supply or logic 1 and the other of the nodes goes to ground or logic 0). In some examples the voltages may not go all the way to supply or ground, e.g., because of other FETS and/or other components that are in the circuit, etc. When nodes OUTM 209 and OUTP 211 reach supply/ground (or near supply/ground), the transient current should become zero irrespective of CLK 201 being "low" or "high". However, because either MN0 229 or MN1 231 would be in an ON state (depending on the output), current can flow from MP4 202 to MP0 203 or MP1 205 and to MN0 229 or MN1 231 until CLK 201 becomes "high".

Figure 2B:
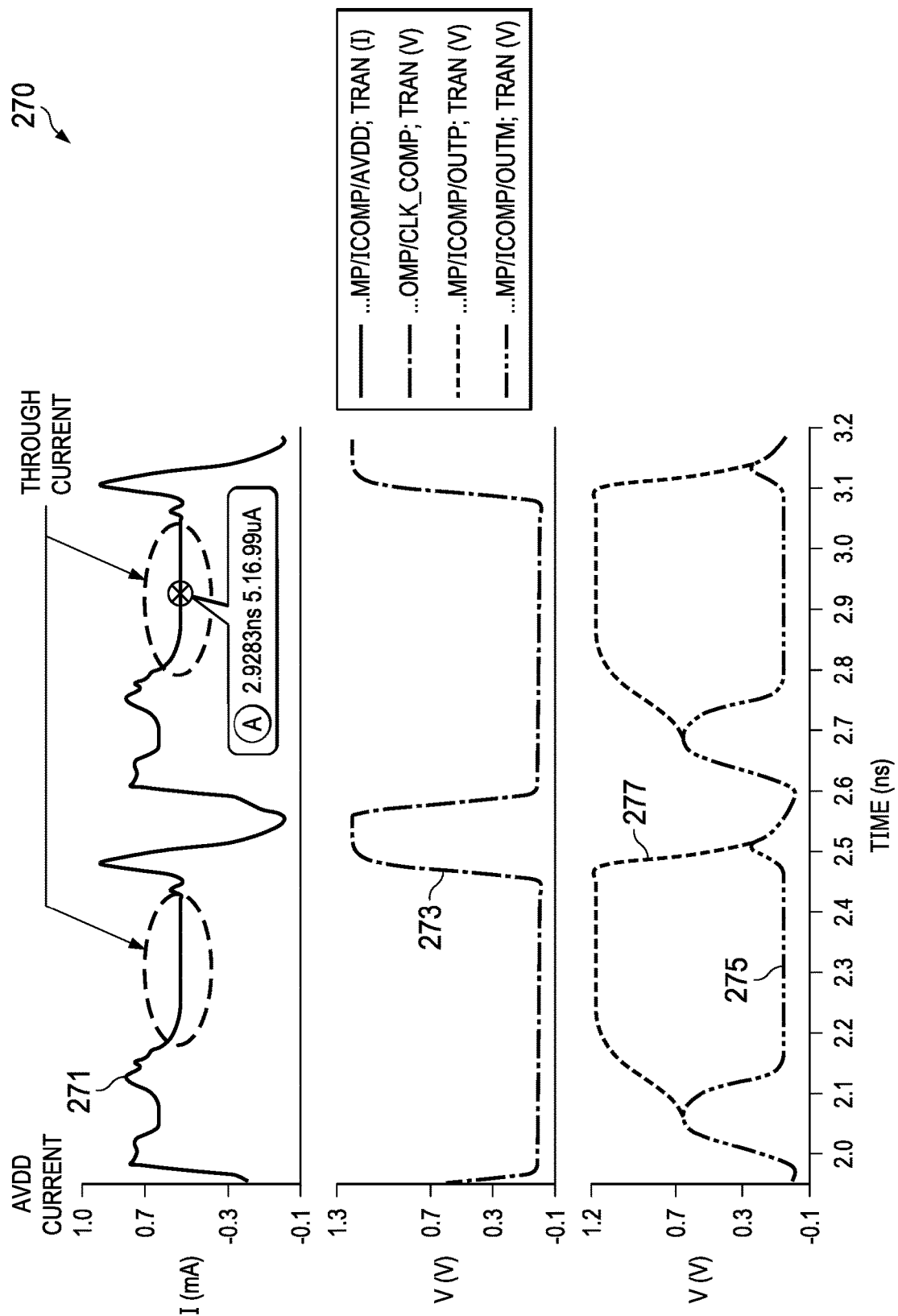
FIG. 2B is a graph of the through current that is conducted in the comparator of FIG. 2A.

FIG. 2B is a graph 270 of the supply-to-ground or "through current" with respect to the CLK 201, and the voltage at the output nodes OUTM 209 and OUTP 211. Referring to FIG. 2B, graph 270 shows that the through current increases when CLK 201 is low and one of outputs OUTP 211 and OUTM 209 is low. In FIG. 2B, trace 271 corresponds to the through current, trace 273 corresponds to CLK 201, and traces 275 and 277 correspond to outputs OUTM 209 and OUTP 211, respectively.

Figure 3:
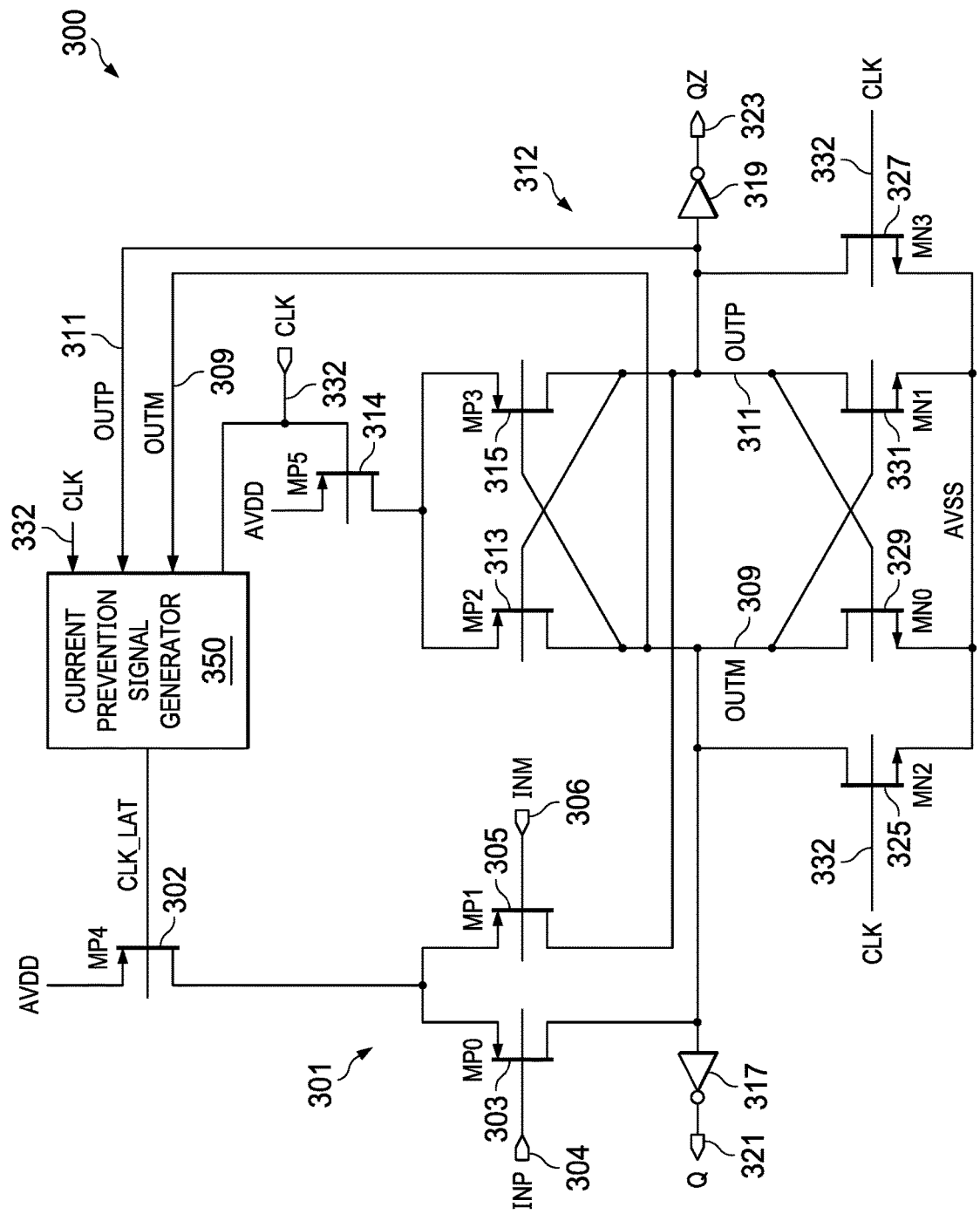
FIG. 3 shows an example comparator that includes a differential amplifier and latch circuit and a supply-to-ground current prevention signal generator.

FIG. 3 shows an example differential amplifier and latch circuit 300 that includes a supply-to-ground current prevention signal generator (e.g., 350). FIG. 3 shows a differential amplifier 300 that includes transistors 302, 303, 305, inputs INP 304 and INM 306 and outputs OUTM 309 and OUTP 311. The differential amplifier 301 is coupled to a latch 312 that includes transistors 313, 315, 329 and 331. In some examples, circuitry 350 to generate a signal to prevent supply-to-ground current is coupled to the differential amplifier and the latch 312.

Referring to FIG. 3, the differential amplifier inputs INP 304 and INM 306 are received by the transistors MP0 303 and MP1 305. In some examples, when the CLK 332 goes "low," the PMOS transistors (MP0 303, MP1 305, MP2 313, MP3 315) are switched on. In response, a differential voltage is developed at nodes OUTM 309 and OUTP 311. Moreover, by virtue of the operation of the latch 312, the nodes OUTM 309 and OUTP 311 go to either supply or ground (e.g., the voltage at one of the nodes goes to supply and the other of the nodes goes to ground). When nodes OUTM 309 and OUTP 311 reach supply/ground, the transient current should become zero irrespective of CLK 332 being "low" or "high." However, because either MN0 329 or MN1 331 would be in an ON state (depending on the output), current can flow from MP4 302 to MP0 303 or MP1 305 and to MN0 329 or MN1 331 until CLK 332 becomes "high." In examples, because the supply-to-ground current prevention signal generator 350 acts to generate a high clock signal when CLK 332 is still low, the path for the supply-to-ground current is cut, and current flow from MP4 302 to MP0 303 or MP1 305 and to MN0 329 or MN1 331 is prevented.

In operation, supply-to-ground current prevention signal generator 350: (1) determines if a decision is made at OUTM 309 and OUTP 311, and (2) based on the decision breaks the path between supply and ground when CLK 332 is still "low". In some examples, the operation of the supply-to-ground current prevention signal generator 350 does not alter the operation of the circuit when CLK 302 is "high."

Figure 4:
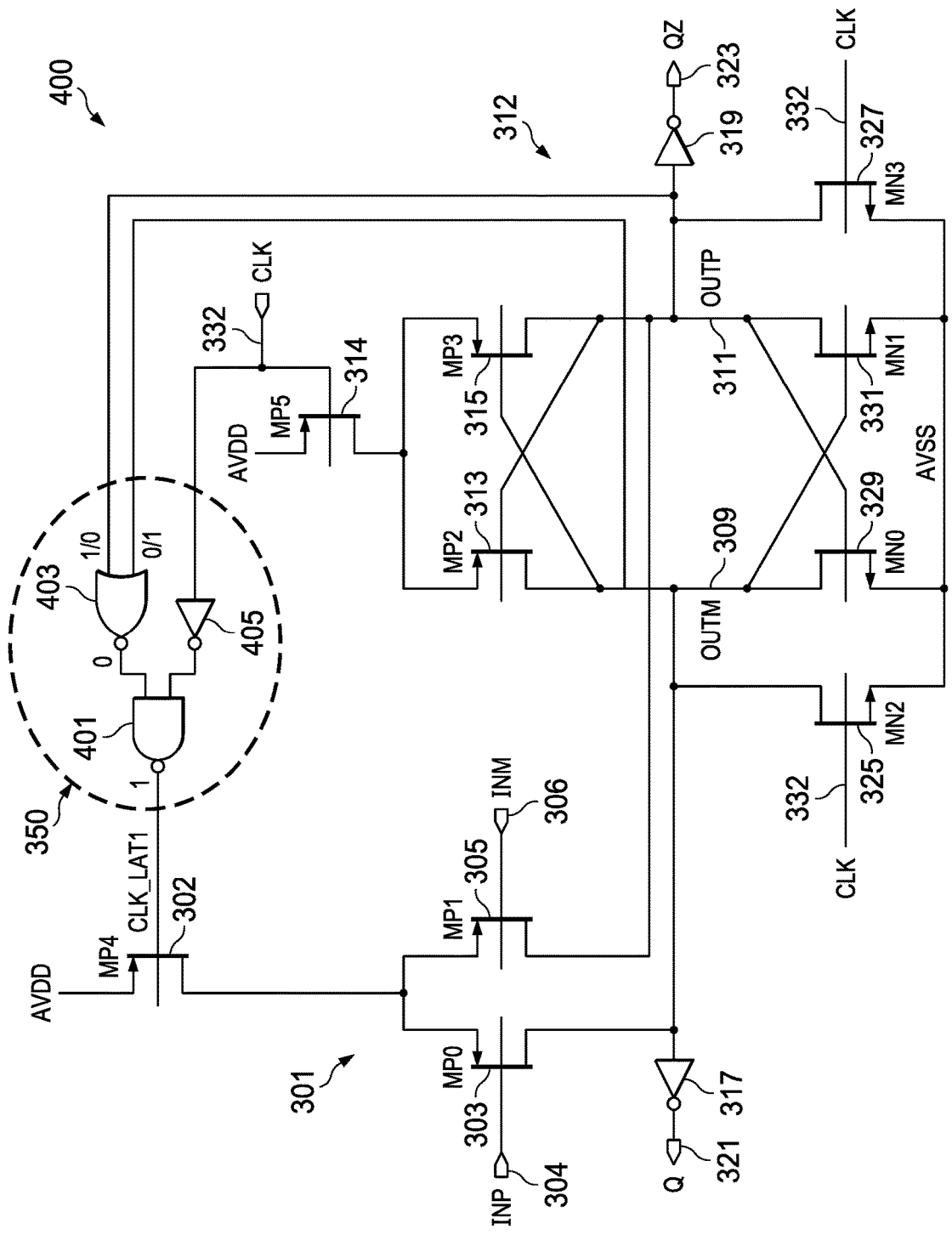
FIG. 4 shows a first example implementation of the supply-to-ground current prevention signal generator shown in FIG. 3.

FIG. 4 shows example implementation of the supply-to-ground current prevention signal generator 350 shown in FIG. 3. FIG. 4 shows in addition to the components shown in FIG. 3, an example supply-to-ground current prevention signal generator 350 that includes NAND gate 401, NOR gate 403 and inverter 405. Referring to FIG. 4, when differential outputs OUTM 309 and OUTP 311 go to supply and ground (logic 1 and 0 and vice versa) logic levels 1 and 0 are placed on the respective inputs to the NOR gate 403 and the low clock signal is provided as the input to inverter 405. The differential inputs to the NOR gate 403 cause the output of the NOR gate 403 to be 0. The 0 placed on the input to the inverter 405 causes the output of the inverter 405 to be 1. The output of the NOR gate 403, logic level 0, and the output of the inverter 405, logic level 1, are placed on the respective inputs to NAND gate 401. As such, the output of the NAND gate 401 is logic level 1, which causes transistor MP4 302 to turn off. In some examples, when the transistor MP4 302 turns OFF, the path for the supply-to-ground current is cut (e.g., MP4 302 does not conduct current), and current flow from MP4 302 to MP0 303 or MP1 305 and to MN0 329 or MN1 331 is prevented.

Figure 5:
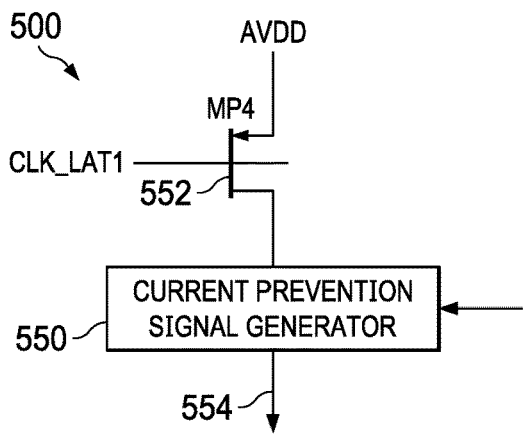
FIG. 5 shows another example of a supply-to-ground current prevention signal generator.

FIG. 5 shows a second example circuit placement of a supply-to-ground current prevention signal generator 550. In the FIG. 5 example, the supply-to-ground current prevention signal generator 550 is connected to the drain of a transistor 552 that is coupled to the supply voltage. In addition, an output 554 of the supply-to-ground current prevention signal generator 550 is coupled to the sources of transistors of the differential amplifier of the associated comparator (MP0 and MP1 in FIGS. 6 and 7). In contrast, in FIG. 3, the supply-to-ground current prevention signal generator 350 is connected to the gate of a transistor that is coupled to the supply voltage.

Figure 6:
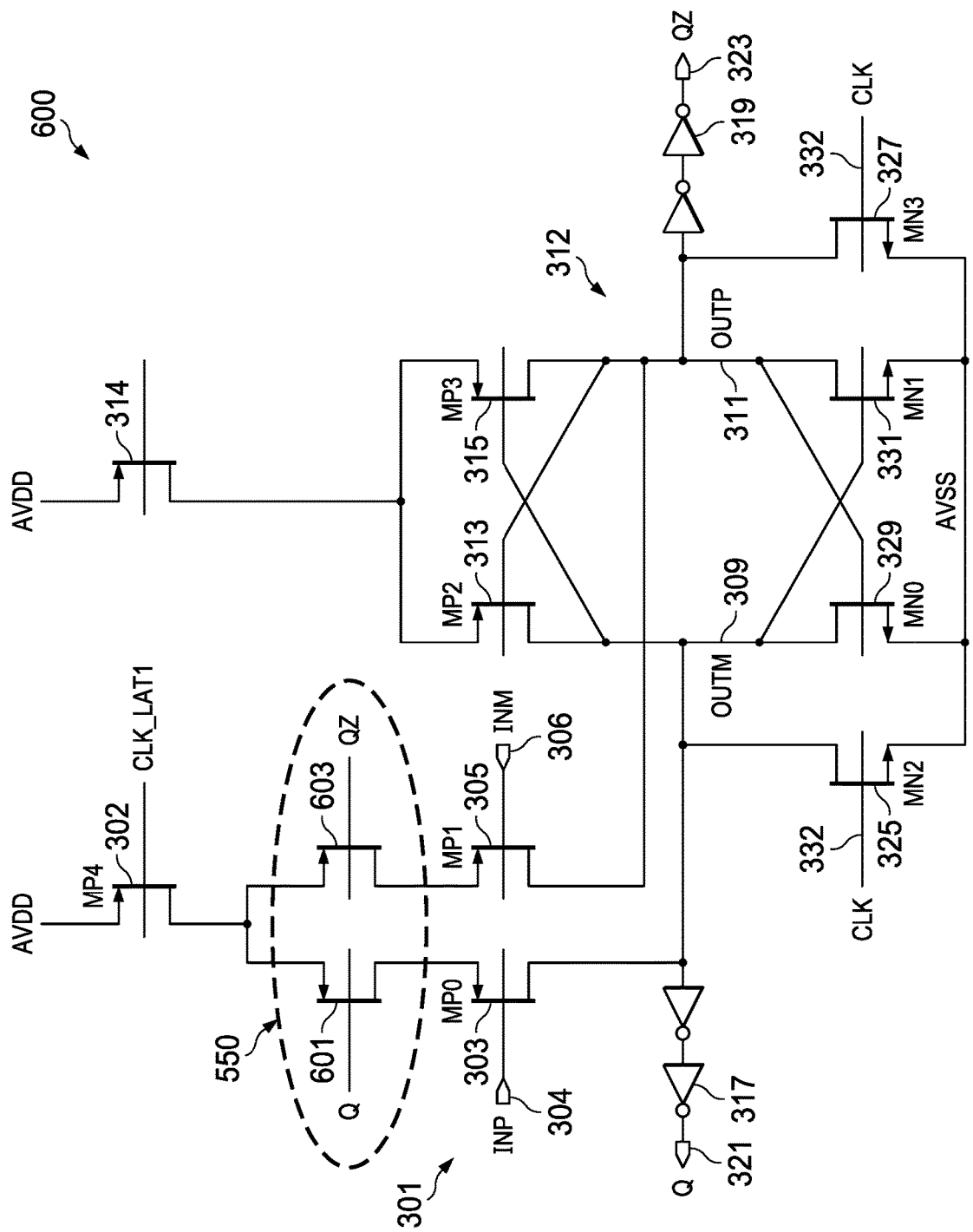
FIG. 6 shows an example implementation of FIG. 5.

FIG. 6 shows an example implementation of the supply-to-ground current prevention signal generator 550 shown in FIG. 5. FIG. 6 shows in addition to the components shown in FIG. 3, supply-to-ground current prevention signal generator 650 that includes a circuit that consists of two PMOS transistors 601 and 603 that are added in series with transistors MP0 303 and MP1 305. Referring to FIG. 6, when differential outputs OUTM 309 and OUTP 311 go to supply and ground (logic 1 and 0 and vice versa) logic levels 1 and 0 are placed on the respective inputs to PMOS transistors 601 and 603 that are added in series with transistors MP0 303 and MP1 305. The transistors 601 and 603 prevent current from flowing through each of the branches connected to the source of transistor MP4 302. The gates of transistors 601 and 603 are coupled to Q and QZ, which are the same as the outputs of the comparator, because each of Q and QZ are generated from a comparator output through two inverters 317, 319. In this manner, the gate of transistor 601 or the gate of transistor 603 is transitioned to a high voltage in order to turn the transistor off in response to a comparator decision. As such, the current that flows through transistor MP4 302 is prevented from flowing through each of the branches connected to the source of transistor MP4 302. In some examples, when the current from transistor MP4 302 is prevented from flowing through each of the branches, the path for the supply-to-ground current is cut, and current flow from MP4 302 to MP0 303 or MP1 305 and to MN0 329 or MN1 331 is prevented.

Figure 7:
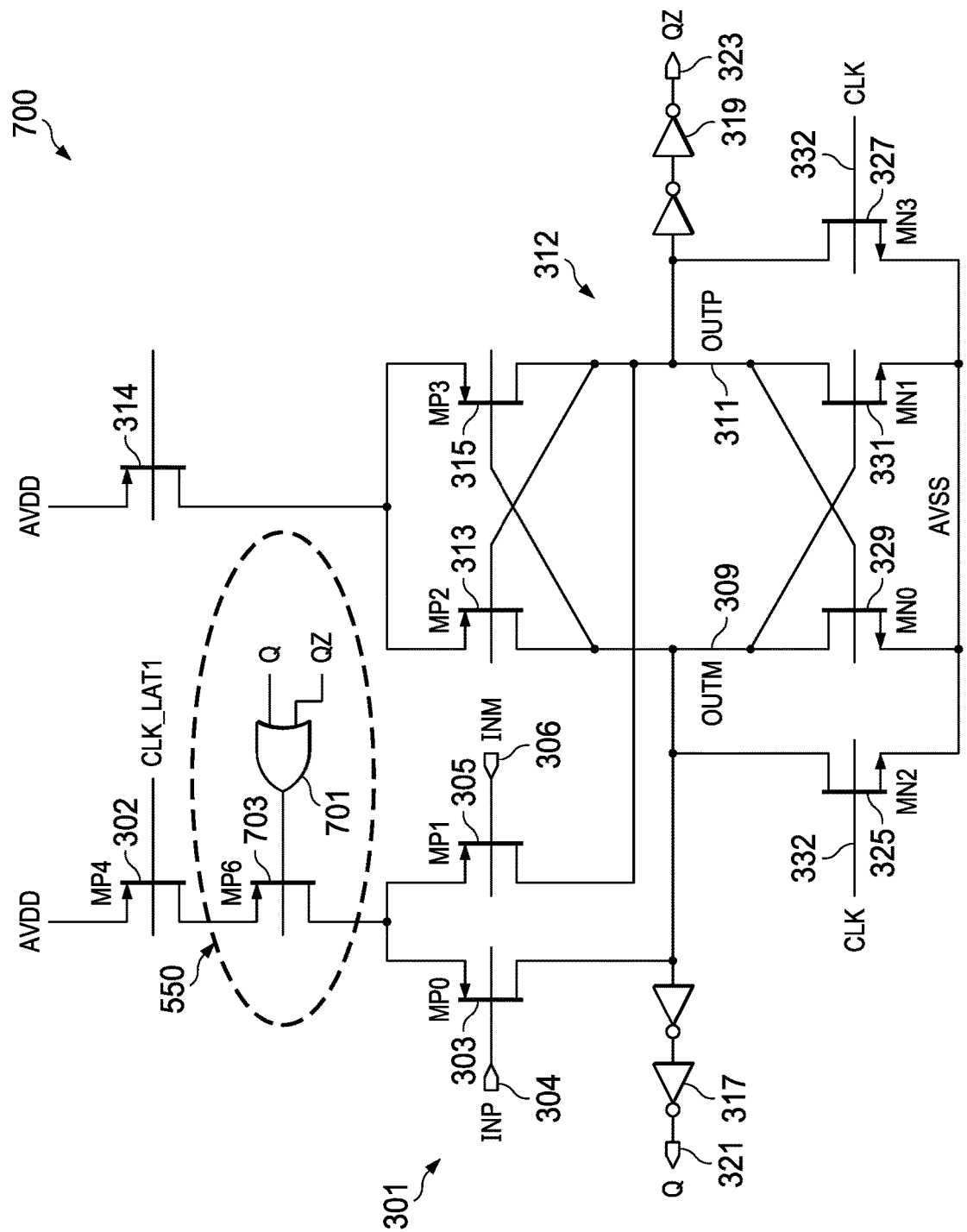
FIG. 7 shows an example implementation of FIG. 5.

FIG. 7 shows a second example implementation of the system to generate a clock shown in FIG. 5. FIG. 7 shows in addition to the components shown in FIG. 3, supply-to-ground current prevention signal generator 550 that includes OR gate 701 coupled to the gate of transistor MP6 703. Referring to FIG. 7, when differential outputs OUTM 309 and OUTP 311 go to supply and ground (logic 1 and 0 and vice versa) logic levels 1 and 0 are placed on the respective inputs to OR gate 701. As such, the current that flows through transistor MP4 301 is prevented from flowing through each of the branches connected to the source of transistor MP4. In some examples, when the current from transistor MP4 302 is prevented from flowing through each of the branches, the path for the supply-to-ground current is cut (the "through current"), and current flow from MP4 302 to MP0 303 or MP1 305 and to MN0 329 or MN1 331 is prevented.

Figure 8:
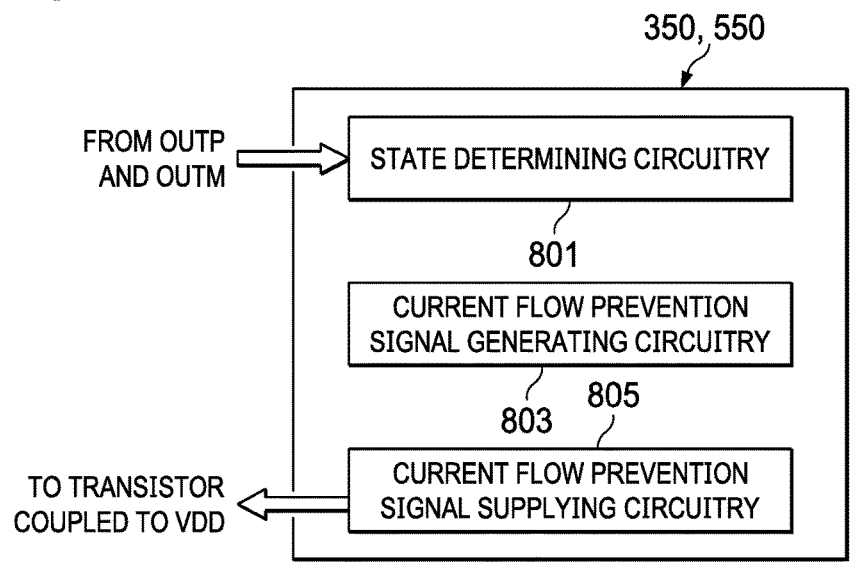
FIG. 8 shows components of a supply-to-ground current prevention signal generator.

FIG. 8 shows components of a supply-to-ground current prevention signal generator 350. FIG. 8 shows state determining circuitry 801, current flow prevention signal generating circuitry 803 and current flow prevention signal supplying circuitry 805.

Referring to FIG. 8, state determining circuitry 801 determines if the voltage at the first and the second output nodes of a comparator (e.g., comprising an amplifier and a latch) has reached supply or ground. In some examples, state determining circuitry 801 includes circuitry that is coupled to first and second output nodes of the comparator.

Current flow prevention signal generating circuitry 803 responsive to a determination of the voltages at the first and the second output nodes, generates a signal that causes the prevention of the flow of supply-to-ground current through the comparator. In some examples, current flow prevention signal generating circuitry 803 generates a modified clock that turns off a transistor that couples the comparator to the supply voltage to ensure that the flow of supply-to-ground current through the comparator is prevented. In other examples, supply to ground current prevention signal generator 350 generates a signal that turns off a transistor coupled to the transistor that couples the comparator to the supply voltage to ensure that the flow of supply-to-ground current through the comparator is prevented.

Current flow prevention signal supplying circuitry 805 supplies a voltage level to one or more transistors of the comparator that turns off one or more transistors to prevent the flow of supply-to-ground current through the comparator. In some examples, the current flow prevention signal supplying circuitry 805 supplies the voltage level to the one or more transistors responsive to a determination that the voltage at the output nodes of the comparator has reached supply and ground respectively.

In some examples, supply-to-ground current prevention signal generator 350 includes a NAND gate and a NOR gate. In some examples, supply-to-ground current prevention signal generator 350 includes a plurality of p-type MOSFETS. In some examples, supply-to-ground current prevention signal generator 350 can include an OR gate coupled to a first transistor that is coupled to a second transistor that is coupled to the supply voltage that is coupled to the comparator. In some examples, the comparator includes a differential amplifier and a latch.

While an example manner of implementing the supply-to-ground current prevention signal generator 350 of FIG. 3 is illustrated in FIG. 8, one or more of the elements, processes and/or devices illustrated in FIG. 8 may be combined, divided, re-arranged, omitted, eliminated and/or implemented in any other way. Further, the example state determining circuitry 801, current flow prevention signal generating circuitry 803 and current flow prevention signal supplying circuitry 805 and/or, more generally, the example supply-to-ground current prevention signal generator 350 of FIG. 3 may be implemented by hardware, software, firmware and/or any combination of hardware, software and/or firmware. Thus, for example, any of the example state determining circuitry 801, current flow prevention signal generating circuitry 803 and current flow prevention signal supplying circuitry 805 and/or, more generally, the example supply-to-ground current prevention signal generator 350 could be implemented by one or more analog or digital circuit(s), logic circuits, programmable processor(s), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example, state determining circuitry 801, current flow prevention signal generating circuitry 803 and current flow prevention signal supplying circuitry 805 is/are hereby expressly defined to include a tangible computer readable storage device or storage disk such as a memory, a digital versatile disk (DVD), a compact disk (CD), a Blu-ray disk, etc. storing the software and/or firmware. Further still, the example supply-to-ground current prevention signal generator 350 of FIG. 3 may include one or more elements, processes and/or devices in addition to, or instead of, those illustrated in FIG. 4, and/or may include more than one of any or all of the illustrated elements, processes and devices.

Figure 9:
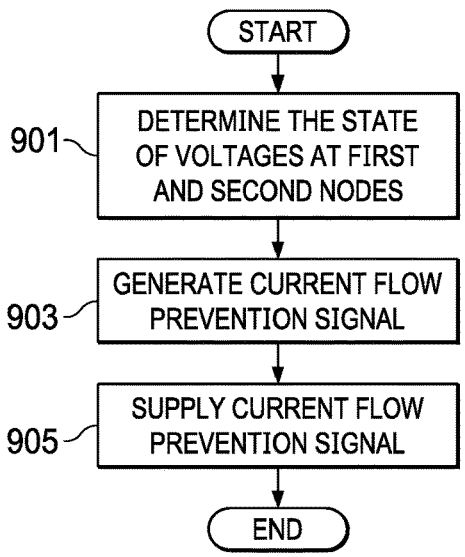
FIG. 9 shows a method to generate a supply-to-ground current prevention signal.

A flowchart representative of example machine readable instructions for implementing the supply-to-ground current prevention signal generator 350 of FIG. 3 is shown in FIG. 9. In this example, the machine readable instructions comprise a program for execution by a processor such as the processor 1012 shown in the example processor platform 1000 discussed below in connection with FIG. 10. The program may be embodied in software stored on a tangible computer readable storage medium such as a CD-ROM, a floppy disk, a hard drive, a digital versatile disk (DVD), a Blu-ray disk, or a memory associated with the processor 1012, but the entire program and/or parts thereof could alternatively be executed by a device other than the processor 1012 and/or embodied in firmware or dedicated hardware. Further, although the example program is described with reference to the flowchart illustrated in FIG. 9, many other methods of implementing the example supply-to-ground current prevention signal generator 350 may alternatively be used. For example, the order of execution of the blocks may be changed, and/or some of the blocks described may be changed, eliminated, or combined.

As mentioned above, the example processes of FIG. 9 may be implemented using coded instructions (e.g., computer and/or machine readable instructions) stored on a tangible computer readable storage medium such as a hard disk drive, a flash memory, a read-only memory (ROM), a compact disk (CD), a digital versatile disk (DVD), a cache, a random-access memory (RAM) and/or any other storage device or storage disk in which information is stored for any duration (e.g., for extended time periods, permanently, for brief instances, for temporarily buffering, and/or for caching of the information). As used herein, the term tangible computer readable storage medium is expressly defined to include any type of computer readable storage device and/or storage disk and to exclude propagating signals and to exclude transmission media. As used herein, "tangible computer readable storage medium" and "tangible machine readable storage medium" are used interchangeably. Additionally or alternatively, the example processes of FIG. 9 may be implemented using coded instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media. As used herein, when the phrase "at least" is used as the transition term in a preamble of a claim, it is open-ended in the same manner as the term "comprising" is open ended.

FIG. 9 is a flowchart of a method to generate a supply-to-ground current prevention signal.

Referring to FIG. 9, state determining circuitry 801 determines if the voltage at the first and the second output nodes of a comparator (e.g., comprising an amplifier and a latch) has reached supply or ground (block 901). In some examples, the voltages at the first and second output nodes may be initially set to a low voltage (e.g., a ground voltage) during a reset phase, and the state determining circuitry 801 may, during a comparison phase, detect when at least one of the voltages at the first and second output nodes transitions from a low voltage to a high voltage. In some examples, state determining circuitry 801 includes circuitry that is coupled to first and second output nodes of the comparator.

Current flow prevention signal generating circuitry 803 responsive to a determination of the voltages at the first and the second output nodes (e.g., a determination that at least one of the voltages at the first and second output nodes transitions from a low voltage to a high voltage), generates a signal that causes the prevention of the flow of supply-to-ground current through the comparator (block 903). In some examples, current flow prevention signal generating circuitry 803 generates a modified clock that turns off a transistor that couples the comparator to the supply voltage to ensure that the flow of supply-to-ground current through the comparator is prevented. In other examples, current flow prevention signal generating circuitry 803 generates a signal that turns off a transistor coupled to the transistor that couples the comparator to the supply voltage to ensure that the flow of supply-to-ground current through the comparator is prevented.

Current flow prevention signal supplying circuitry 805 supplies a voltage level to one or more transistors of the comparator that turns off one or more transistors to prevent the flow of supply-to-ground current through the comparator (block 905). In some examples, the current flow prevention signal supplying circuitry 805 supplies the voltage level to the one or more transistors responsive to a determination that the voltage at the output nodes of the comparator has reached supply and ground respectively.

Figure 10:
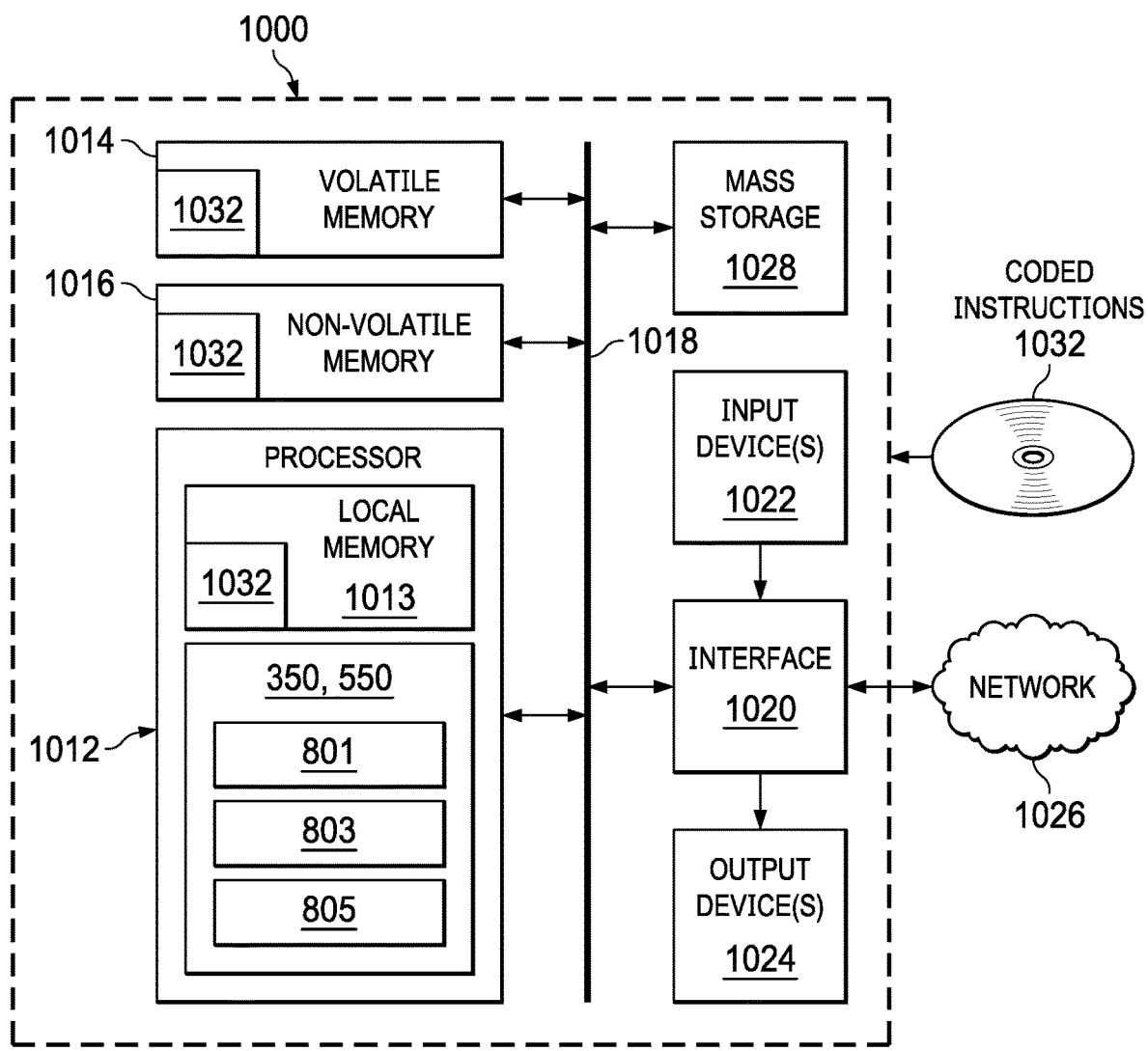
FIG. 10 is a block diagram of an example processor platform capable of executing the instructions of FIG. 9.

FIG. 10 is a block diagram of an example processor platform 1000 capable of executing the instructions of FIG. 9 to implement the supply-to-ground current prevention signal generator 350 of FIG. 3. The processor platform 1000 can be, for example, a server, a personal computer, a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, or any other type of computing device.

The processor platform 1000 of the illustrated example includes a processor 1012. The processor 1012 of the illustrated example is hardware. For example, the processor 1012 can be implemented by one or more integrated circuits, logic circuits, microprocessors or controllers from any desired family or manufacturer.

The processor 1012 of the illustrated example includes a local memory 1013 (e.g., a cache). The processor 1012 of the illustrated example is in communication with a main memory including a volatile memory 1014 and a non-volatile memory 1016 via a bus 1018. The volatile memory 1014 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 1016 may be implemented by flash memory and/or any other desired type of memory device. Access to the main memory 1014, 1016 is controlled by a memory controller.

The processor platform 1000 of the illustrated example also includes an interface circuit 1020. The interface circuit 1020 may be implemented by any type of interface standard, such as an Ethernet interface, a universal serial bus (USB), and/or a PCI express interface.

In the illustrated example, one or more input devices 1022 are connected to the interface circuit 1020. The input device(s) 1022 permit(s) a user to enter data and commands into the processor 1012. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 1024 are also connected to the interface circuit 1020 of the illustrated example. The output devices 1024 can be implemented, for example, by display devices (e.g., a light emitting diode (LED), an organic light emitting diode (OLED), a liquid crystal display, a cathode ray tube display (CRT), a touchscreen, a tactile output device, a printer and/or speakers). The interface circuit 1020 of the illustrated example, thus, typically includes a graphics driver card, a graphics driver chip or a graphics driver processor.

The interface circuit 1020 of the illustrated example also includes a communication device such as a transmitter, a receiver, a transceiver, a modem and/or network interface card to facilitate exchange of data with external machines (e.g., computing devices of any kind) via a network 1026 (e.g., an Ethernet connection, a digital subscriber line (DSL), a telephone line, coaxial cable, a cellular telephone system, etc.).

The processor platform 1000 of the illustrated example also includes one or more mass storage devices 1028 for storing software and/or data. Examples of such mass storage devices 1028 include floppy disk drives, hard drive disks, compact disk drives, Blu-ray disk drives, RAID systems, and digital versatile disk (DVD) drives.

The coded instructions 1032 of FIG. 9 may be stored in the mass storage device 1028, in the volatile memory 1014, in the non-volatile memory 1016, and/or on a removable tangible computer readable storage medium such as a CD or DVD.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. An apparatus comprising:
   an inverter having a clock input and an output;
   a NOR gate having a first input, a second input, and an output, the first input adapted to be coupled to a first output of a comparator and the second input adapted to be coupled to a second output of the comparator;
   a NAND gate having a first input, a second input, and an output, the first input is coupled to the output of the NOR gate and the second input is coupled to the output of the inverter; and
   a transistor having a gate electrode, a source electrode, and a drain electrode, the gate electrode is coupled to the output of the NAND gate.

2. The apparatus of claim 1, wherein the source electrode of the transistor is adapted to be coupled to a supply voltage source.

3. The apparatus of claim 1, further comprising a second transistor having a source electrode and a third transistor having a source electrode, and wherein the drain electrode of the transistor is coupled to: (1) the source electrode of the second transistor; and (2) the source electrode of the third transistor.

4. The apparatus of claim 1, further comprising a plurality of transistors coupled to the transistor.

5. The apparatus of claim 1, further comprising a second transistor having a gate electrode, a source electrode, and a drain electrode, the gate electrode of the second transistor is coupled to the output of the NAND gate.

6. The apparatus of claim 1, wherein the comparator includes a differential amplifier and a latch.

7. An method comprising:
receiving, by an inverter, a clock signal;
receiving, by a NOR gate, a first output of a comparator and a second output of the comparator;
receiving, by a NAND gate, an output from the NOR gate and an output from the inverter;
supplying, by the NAND gate, a signal to a transistor.

8. The method of claim 7, wherein the transistor is coupled to a supply voltage source.

9. The method of claim 7, wherein the comparator includes a differential amplifier and a latch.

* * * * *